United States Patent
Mercier et al.

(10) Patent No.: US 9,591,778 B1
(45) Date of Patent: Mar. 7, 2017

(54) VIDEO DISPLAY CONVERTIBLE HANDLE AND KICKSTAND UNIT

(71) Applicant: G.A.E.M.S., Inc., Redmond, WA (US)

(72) Inventors: Dean Thomas Mercier, Bellevue, WA (US); Kevin O'Doherty, Hong Kong (CN)

(73) Assignee: G.A.E.M.S., Inc., Bothell, WA (US)

(*) Notice: Subject to any disclaimer, the term of this patent is extended or adjusted under 35 U.S.C. 154(b) by 0 days.

(21) Appl. No.: 14/842,641

(22) Filed: Sep. 1, 2015

(51) Int. Cl.
*G06F 1/16* (2006.01)
*H05K 5/02* (2006.01)
*H05K 5/00* (2006.01)

(52) U.S. Cl.
CPC ......... *H05K 5/0234* (2013.01); *H05K 5/0017* (2013.01)

(58) Field of Classification Search
CPC .................................................. H05K 5/0234
See application file for complete search history.

(56) References Cited

U.S. PATENT DOCUMENTS

| | | | | |
|---|---|---|---|---|
| 6,651,943 B2* | 11/2003 | Cho | ........... | F16M 11/00 248/122.1 |
| 6,918,562 B2* | 7/2005 | Lee | ........... | F16M 11/00 248/130 |
| 7,660,113 B2* | 2/2010 | Kaneko | ........... | F16M 13/00 361/679.59 |
| 7,864,515 B2* | 1/2011 | Numata | ........... | F16M 13/00 248/122.1 |
| 8,152,113 B2* | 4/2012 | Chen | ........... | F16M 11/10 16/319 |
| 8,400,767 B2* | 3/2013 | Yeom | ........... | F16M 11/10 248/917 |
| 8,605,429 B2* | 12/2013 | Shen | ........... | F16M 11/105 248/371 |
| 9,052,873 B2* | 6/2015 | Murakata | ........... | G06F 1/1626 |
| 2005/0257341 A1* | 11/2005 | Chen | ........... | F16M 11/00 16/17.1 |
| 2006/0049327 A1* | 3/2006 | Chen | ........... | F16M 11/00 248/371 |
| 2006/0050471 A1* | 3/2006 | Chen | ........... | G06F 1/1601 361/679.22 |
| 2006/0077623 A1* | 4/2006 | Yeh | ........... | G06F 1/1601 361/679.22 |
| 2006/0082957 A1* | 4/2006 | Chen | ........... | G06F 1/1601 361/679.21 |
| 2007/0127197 A1* | 6/2007 | Tae | ........... | G06F 1/1626 361/679.27 |

* cited by examiner

Primary Examiner — Anthony Q Edwards
(74) Attorney, Agent, or Firm — Fenwick & West LLP

(57) ABSTRACT

A display device with a support member selectively converted between a support stand for supporting the display device for viewing, and a carrying handle for conveniently carrying the display device. A mounting apparatus may be mounted on a rear side of a display device that has a support member selectively convertable to be a support stand for supporting the display device for viewing, or a carrying handle for conveniently carrying the display device. The support member has an internal swivel assembly that guides the support member along a fixed path between a support stand mode and a carrying handle mode.

7 Claims, 23 Drawing Sheets

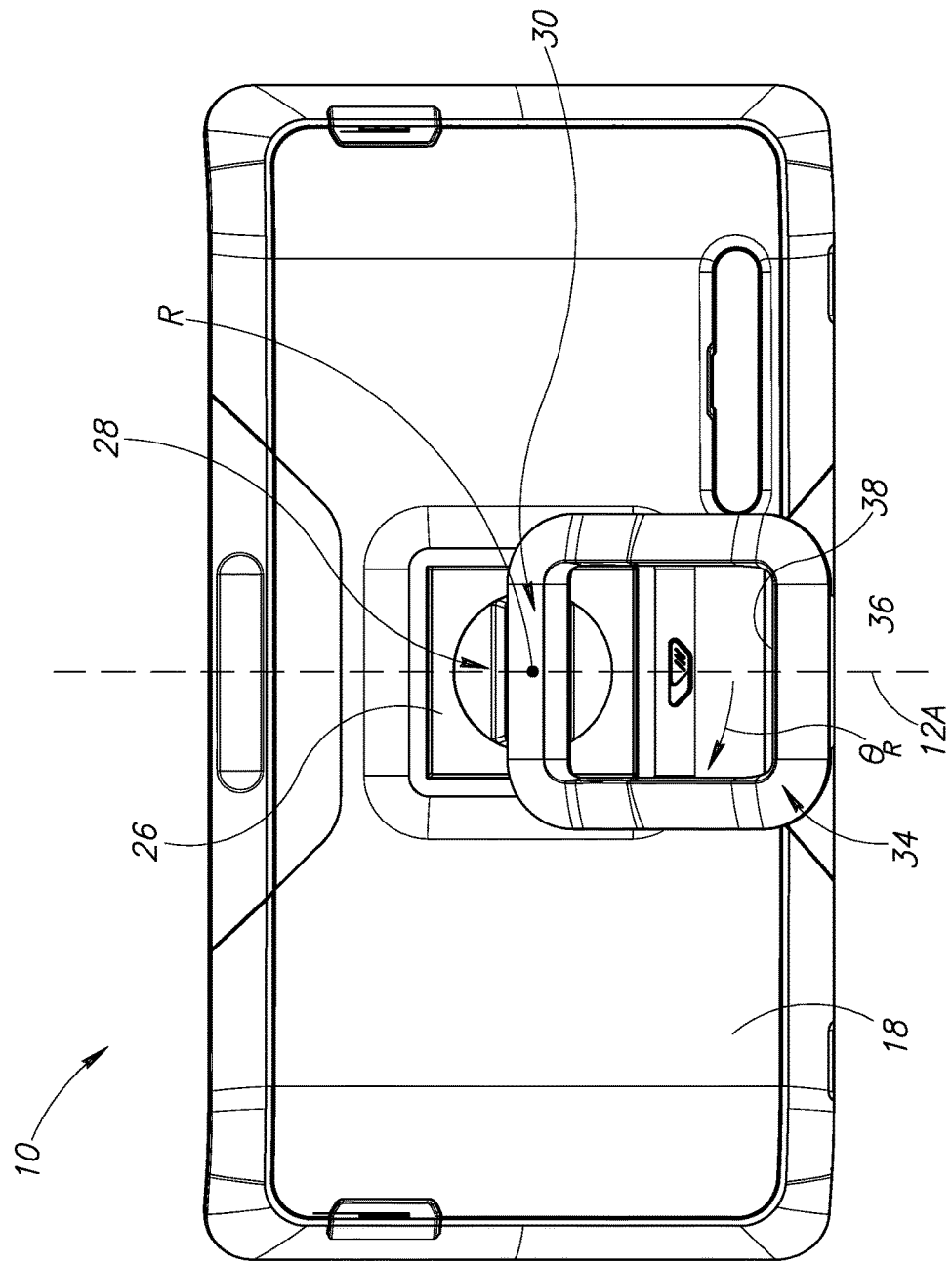

VIDEO DISPLAY CONVERTIBLE HANDLE AND KICKSTAND UNIT

FIELD OF INVENTION

The present invention is generally directed to an apparatus that may be selectively converted between a stand for a display device and a carrying handle for the display device.

BACKGROUND

The following description includes information that may be useful in understanding the present invention. It is not an admission that any of the information provided herein is prior art or relevant to the presently claimed invention, or that any publication specifically or implicitly referenced is prior art.

Consumers may wish to carry display devices from their home to other destinations to play games or watch movies. Therefore, it is desirable to have a display device that is highly portable. Some display devices currently available on the market do not have a handle and require consumers to carry display devices awkwardly, risking damage to the display device. Carrying cases offer some portability for smaller display devices; however, stowing display devices and the associated hardware in carrying cases may be time consuming and involves cost and storage of the carrying case when not in use. Portable display devices on the market do not have a stand that provides an optimal viewing angle. Nor do portable displays currently available have a stand that allows for convenient carry or storage.

BRIEF DESCRIPTION OF THE DRAWINGS

Exemplary embodiments are illustrated in the referenced figures. The embodiments and figures disclosed herein are intended to be illustrative rather than restrictive.

FIG. 5A is a rear view of the display device of FIG. 1 with the support member in a first position.

DETAILED DESCRIPTION

One skilled in the art will recognize many methods, systems, and materials similar or equivalent to those described herein. The present invention is in no way limited to the methods, systems, and materials described.

Figure 1:
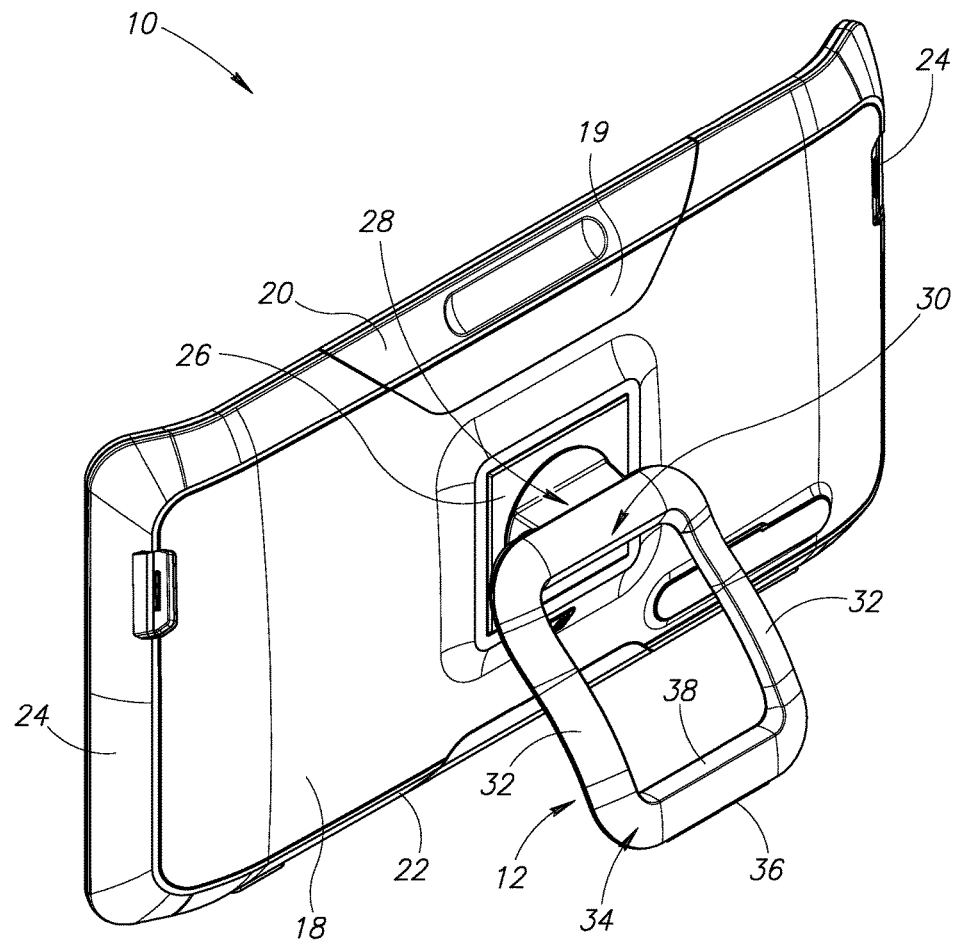
FIG. 1 is a rear top, right side perspective view of a display device with a support member in a support stand position.
Figure 2:
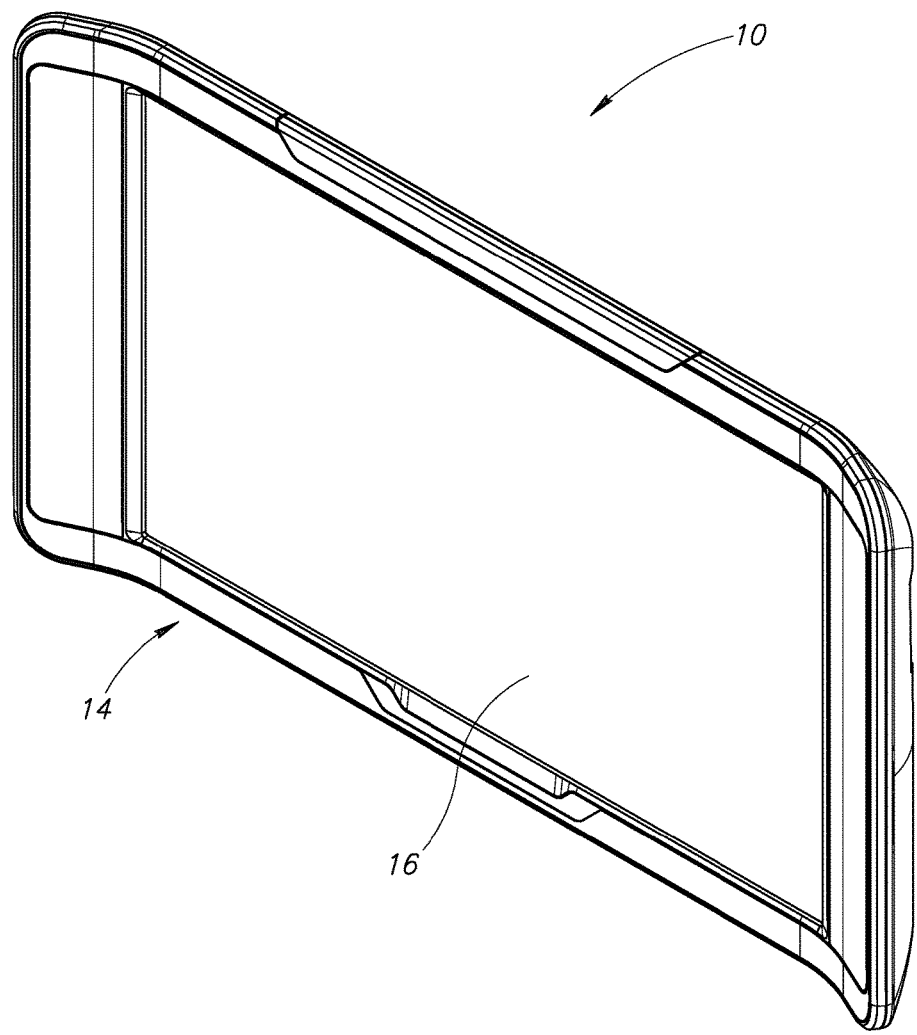
FIG. 2 is a front top, right side perspective view of the display device of FIG. 1.

A display device 10 has a support member 12, as shown in FIG. 1. As seen in FIG. 2, the display device 10 has a display side 14 with a display screen 16 for viewing images generated by a computer or other video circuitry (not shown). The display device 10 has a rear side 18 with a swivel portion 28. The support member 12 extends from the swivel portion 28 in a direction away from the rear side 18, as seen in FIG. 1. The display device 10 also has a top 20, a bottom 22, and right and left sides 24.

An attachment portion 26 attaches the support member 12 to the rear side 18 of the display device 10. The swivel portion 28 rotatably connects a proximate end portion 30 of the support member 12 to the attachment portion 26, as described later in greater detail. Right and left support arms 32 extend from the proximate end portion 30. A distal end portion 34 of the support member 12 is located at the ends of and extends between the support arms 32 spaced apart from and opposing the proximate end portion 30. The distal end portion 34 has a base portion 36 and a gripping portion 38. Although the display device 10 of the current embodiment has two support arms 32, the number of support arms 32 is not particularly limited. By way of non-limiting example, the support member 12 may instead only have a single support arm 32 extending between a central portion of the proximate end portion 30 and the distal end portion 34. In such a configuration, the support member 12 may have a "T" shape instead of the open rectangular shape shown in FIG. 1. However, it is preferred that the support member 12 has an open rectangular shape to facilitate easy gripping of the support member 12.

Figure 3:
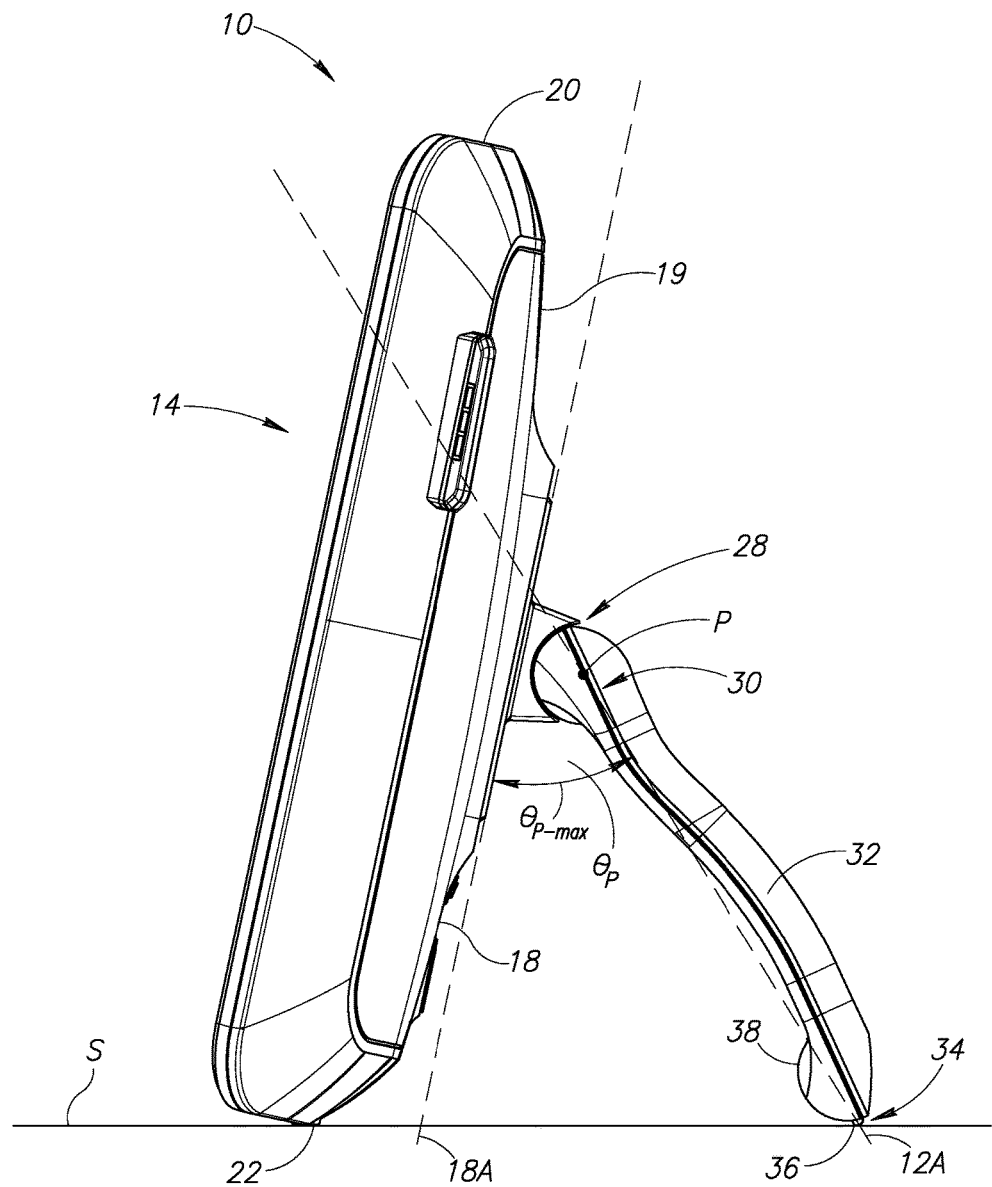
FIG. 3 is a right side view of the display device of FIG. 1.

The support member 12 may be converted between a support stand mode and a carrying handle mode. In the support stand mode, the display device 10 may be placed on a surface S, such as a table, to view images on the display screen 16, as seen in FIG. 3. In the support stand mode shown in FIGS. 5A and 6A, the support member 12 extends in a generally downward and rearward direction from the rear side 18 of the display device 10 and supports the display device against rearward rotational movement while the bottom side 22 supports the display device 10 from below when the display device is placed on the surface S. Therefore, the display device 10 is supported in a substantially upright position to allow a user to view images generated on the display screen 16. The base portion 36 and/or the bottom portion 22 may have high friction portions, such as a rubber material, to prevent the display device 10 from sliding along the surface S. Although the bottom portion 22 is a bottom surface of the display device 10, the bottom portion 22 may instead be a display device base stand that elevates the display device 10 above a surface. The distal end portion 34 is spaced apart from the rear side 18 of the display device 10 to provide a wide and stable base, much like a kickstand, as well as an optimal viewing angle for the display screen 16.

Figure 4:
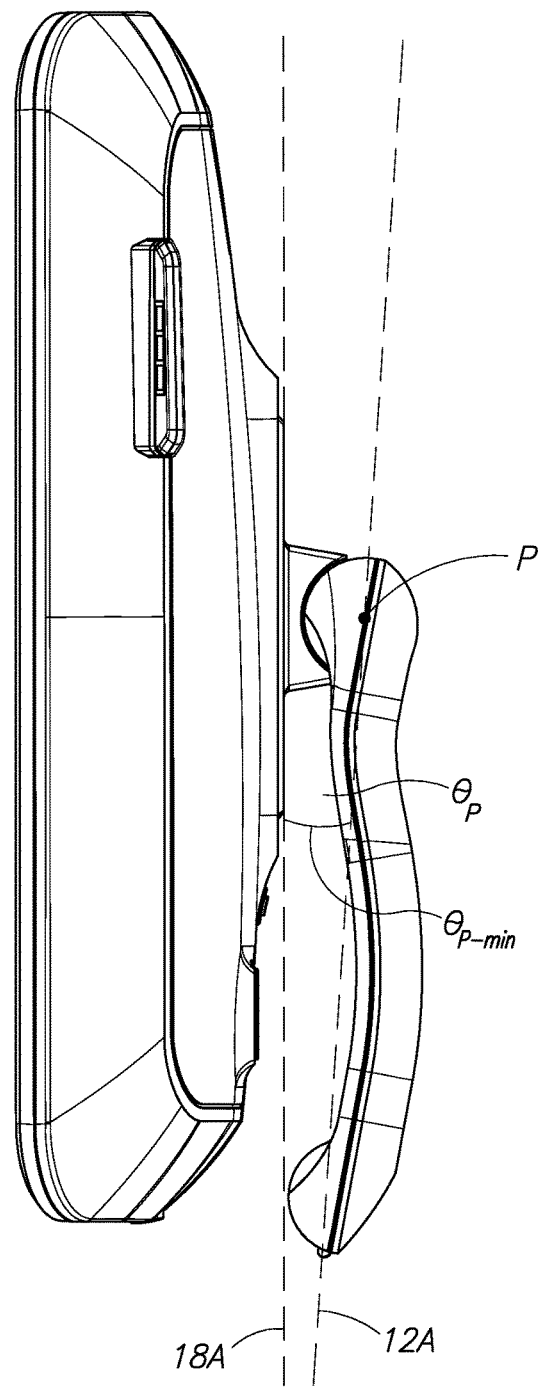
FIG. 4 is a right side view of the display device of FIG. 1 with a support member in an inward folded position according to a first embodiment.
Figure 5B:
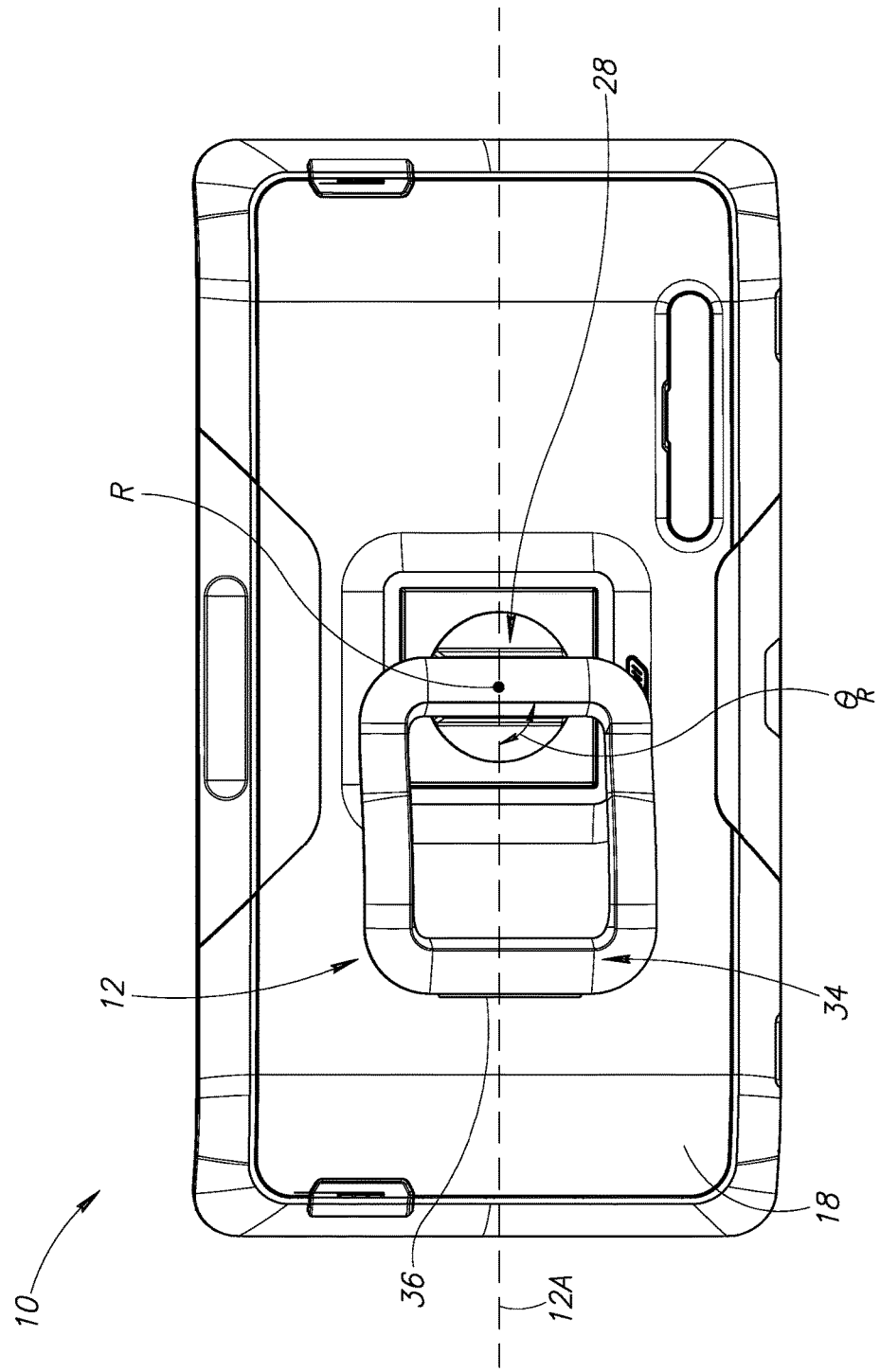
FIG. 5B is a rear view of the display device of FIG. 1 with the support member in a second position.
Figure 5C:
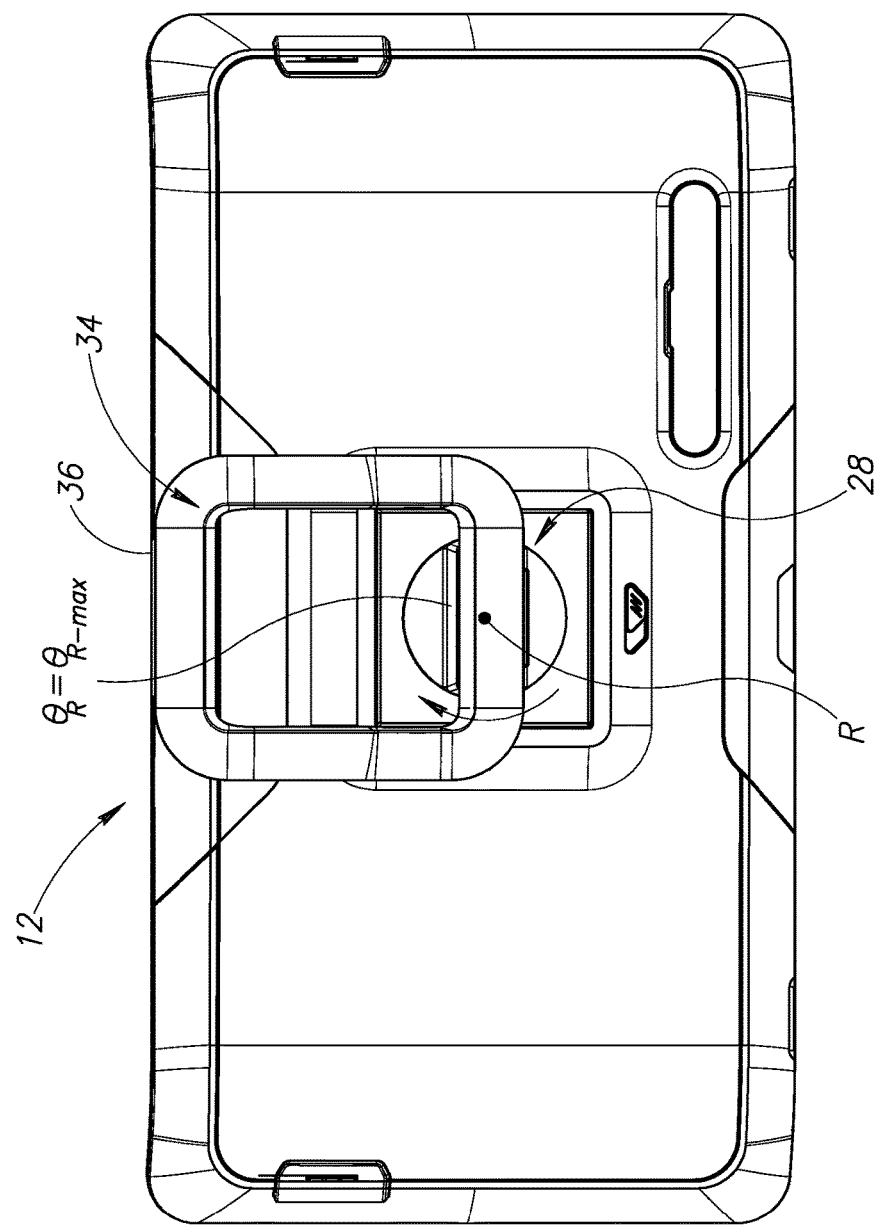
FIG. 5C is a rear view of the display device of FIG. 1 with the support member in a third position for use to carry the display device.
Figure 6A:
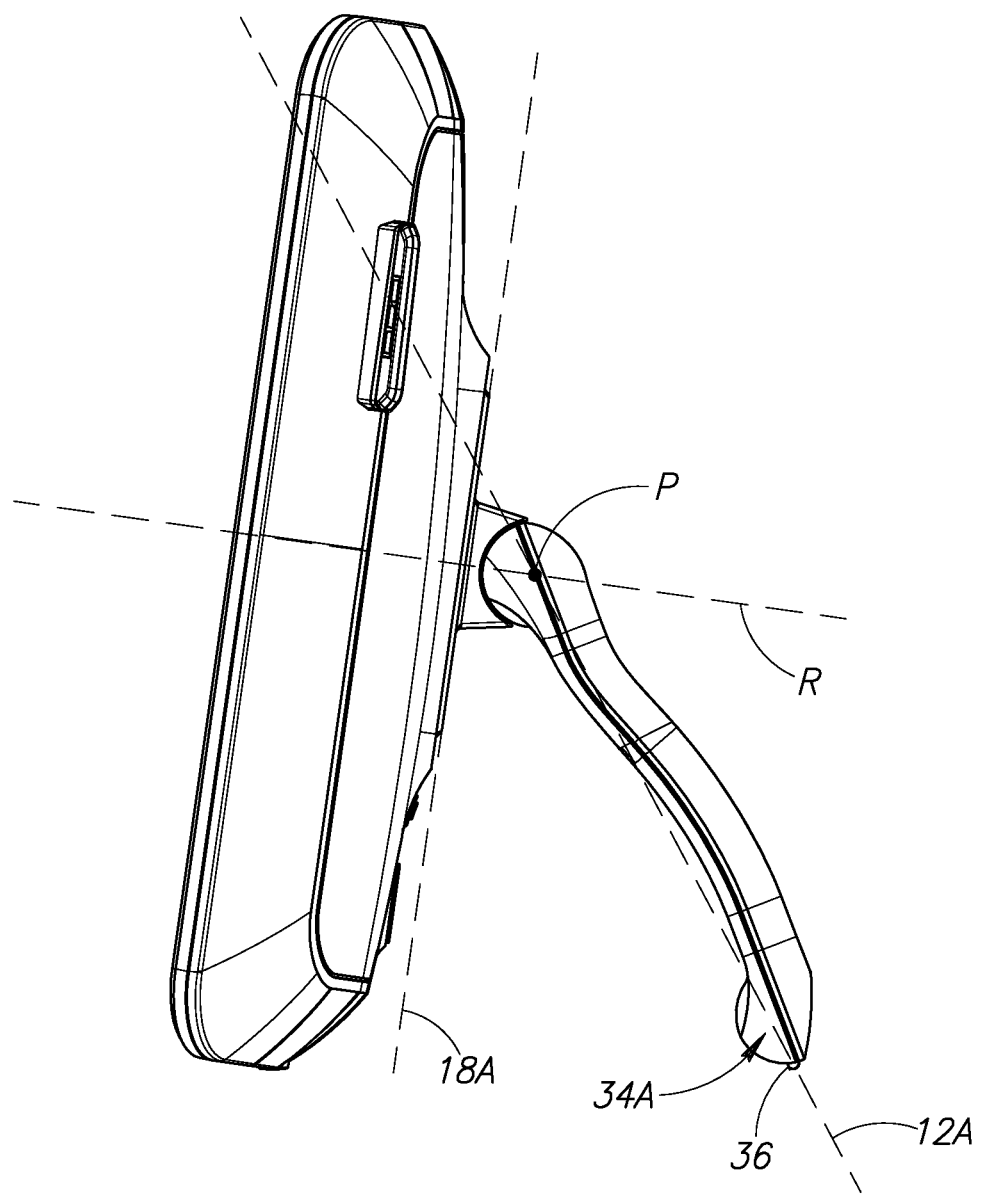
FIG. 6A is a right side view of the display device of FIG. 1 with the support member in the first position of FIG. 5A.
Figure 6B:
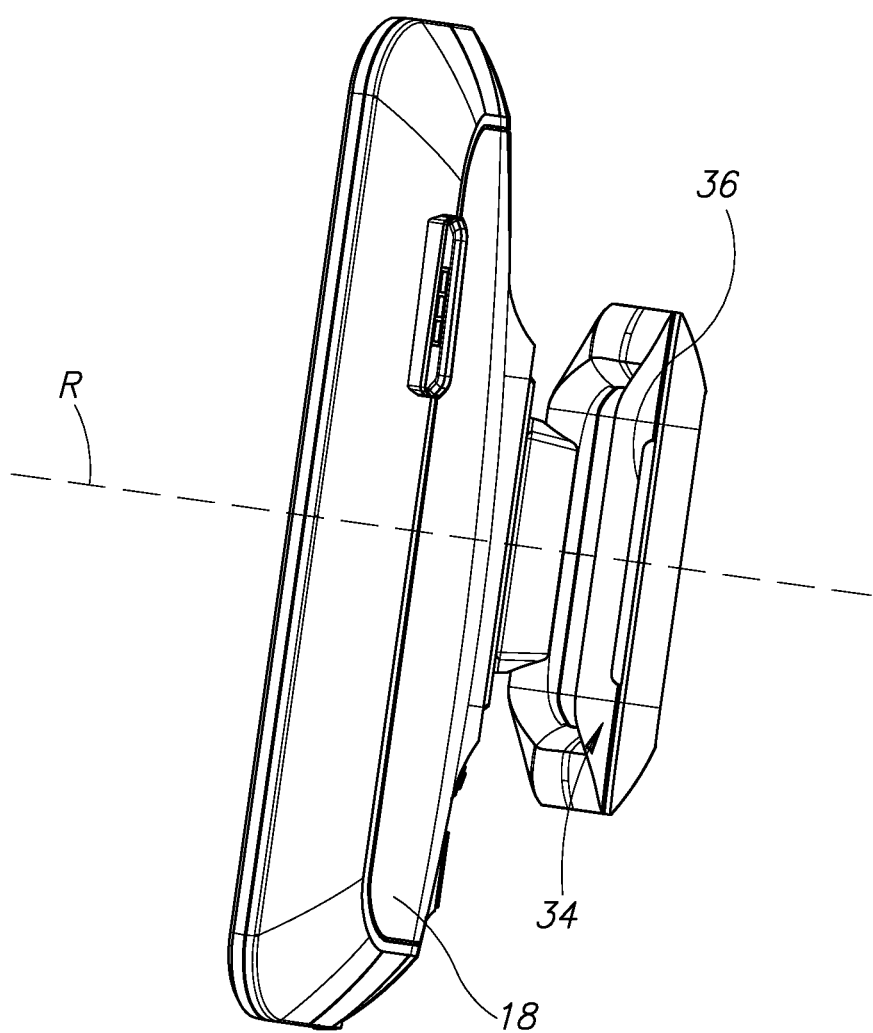
FIG. 6B is a right side view of the display device of FIG. 1 with the support member in the second position of FIG. 5B.
Figure 6C:
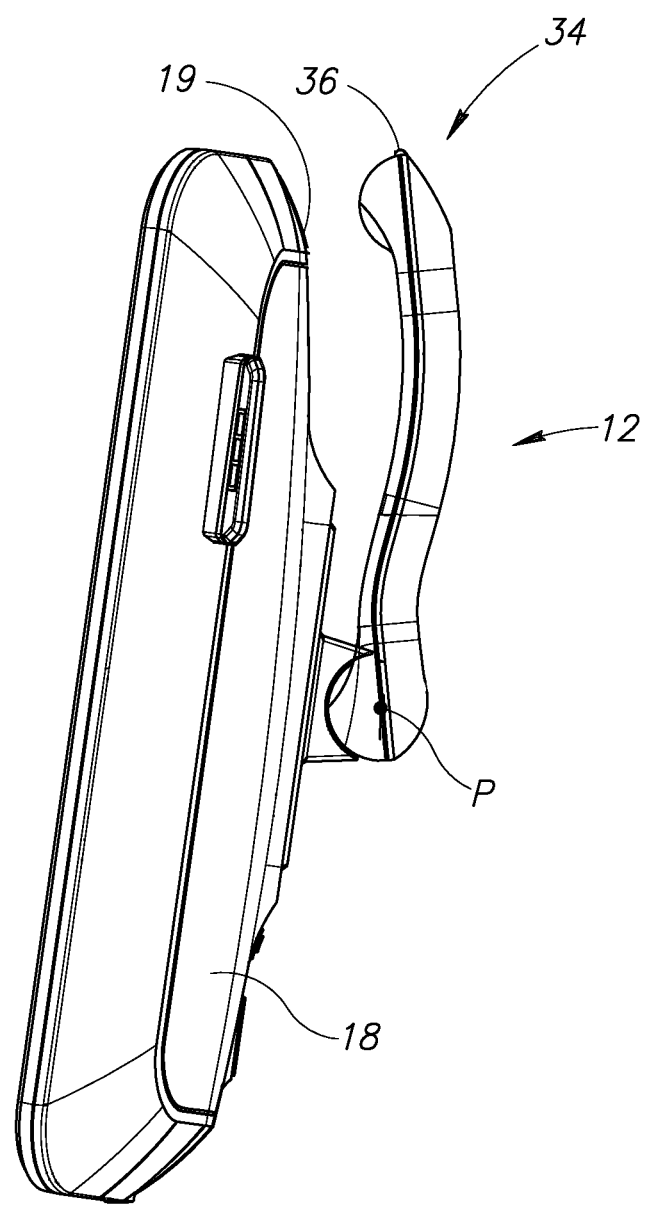
FIG. 6C is a right side view of the display device of FIG. 1 with the support member in the third position of FIG. 5C.
Figure 7:
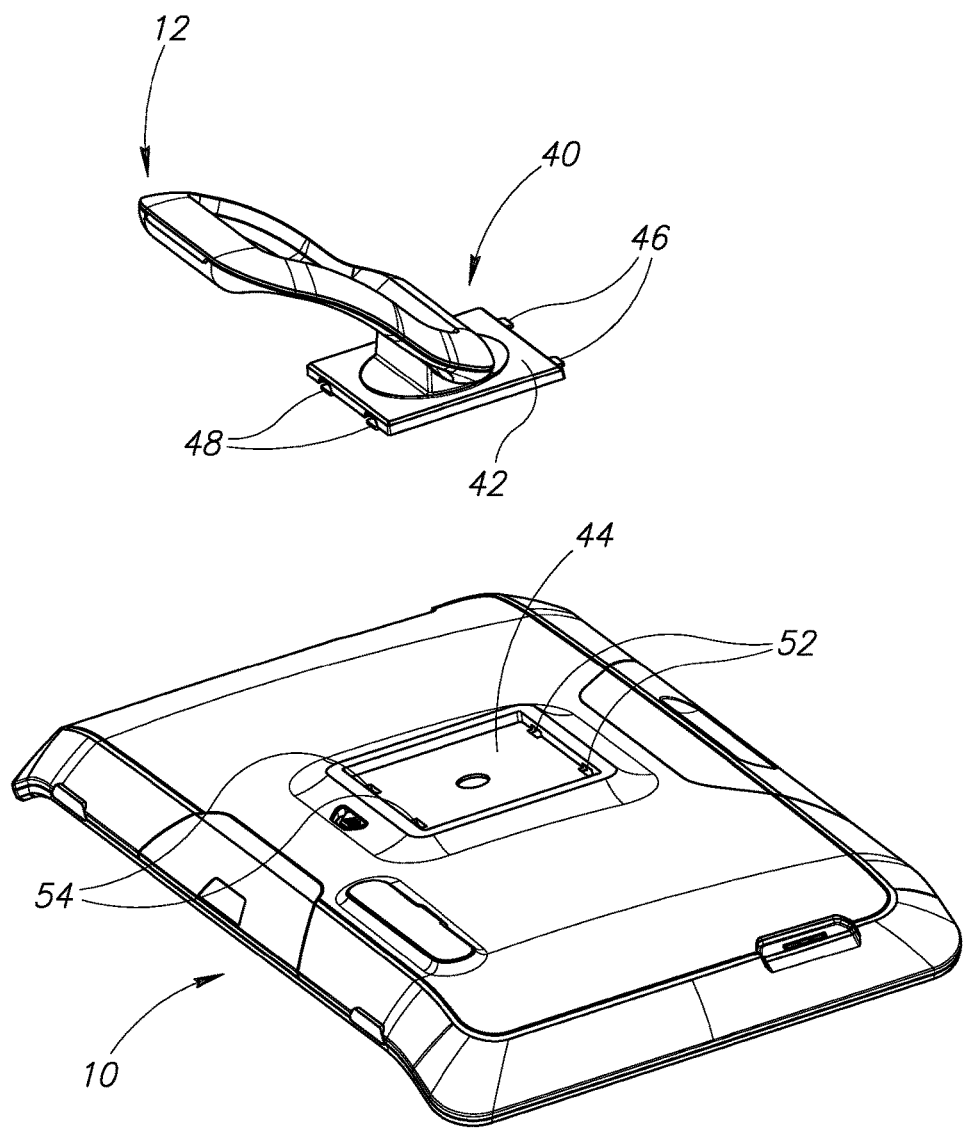
FIG. 7 is a rear left side perspective view of a mounting apparatus of the support member of FIG. 1 separated from the display device.
Figure 8:
FIG. 8 is a rear top, right side perspective view of the mounting apparatus of FIG. 7.
Figure 12:
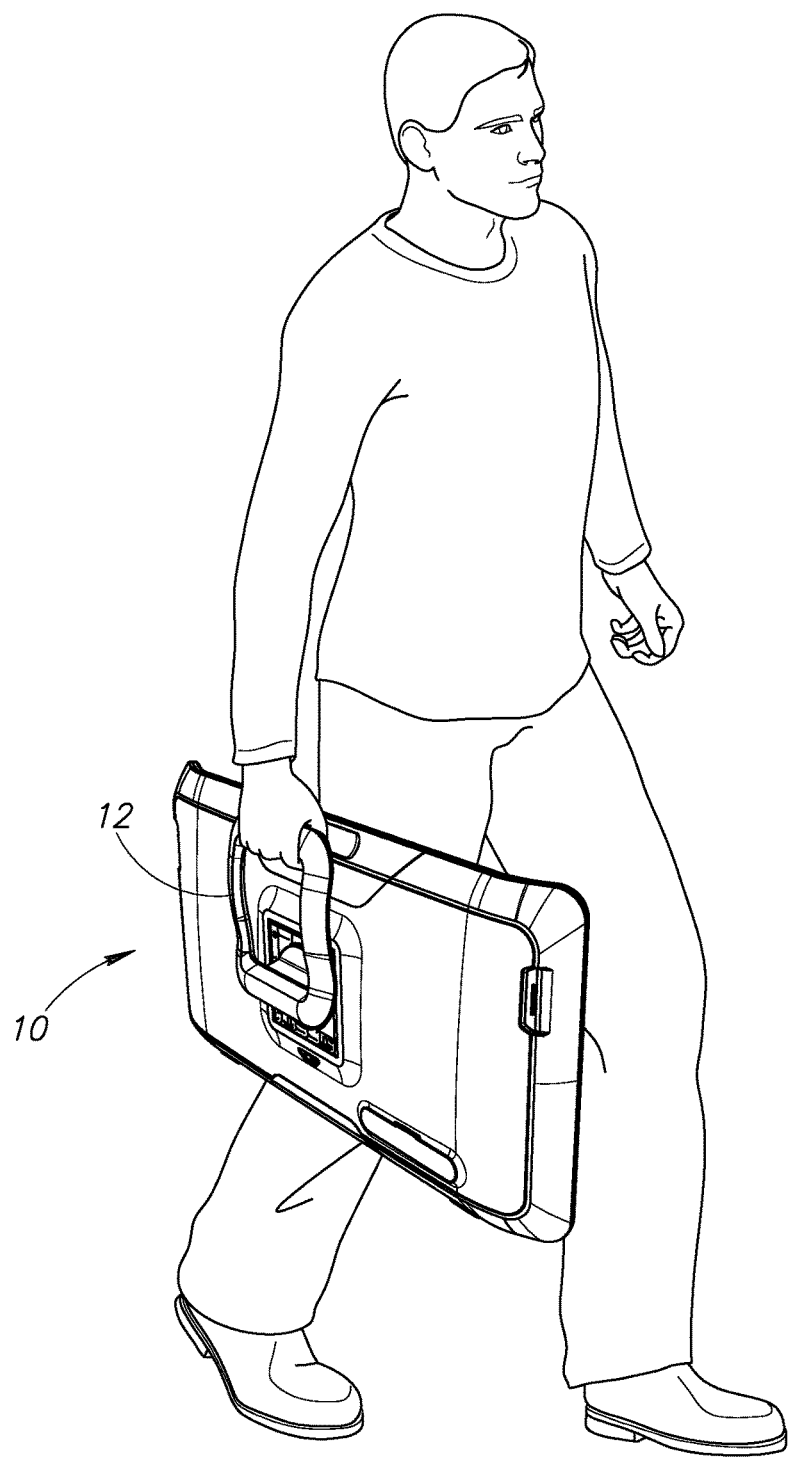
FIG. 12 illustrates the display device of FIG. 1 being carried when the support member is in the carrying position (the third position of FIGS. 5C and 6C).

The support member 12 may be folded inward from the support stand position shown in FIGS. 5A and 6A to the position showing in FIG. 4. In the inward folded position (see FIG. 4) and the upward carrying position (see FIGS. 5C and 6C) for using the support member as a carrying handle, the distal end portion 34 is located close to the rear side 18 of the display device 10. When in the carrying position the support member allows a user to carry the display device 10 in a substantially vertical orientation, as seen in FIG. 12. The display device 10 may be transitioned from the support stand mode to the carrying handle mode by moving the distal end portion 34 toward the rear side 18 to the inward folded position, as seen in FIG. 4. Once the distal end portion 34 is close to the rear side 18, the support arm 12 may be locked into place. If desired, a user may then flip the display device 10 over and carry the display device 10 by grasping the gripping portion 38 of the distal end portion 34 of the support member 12. It may be preferred, however, to rotate the support member 12 around a rotation axis R to an upward projecting carrying position, as seen in FIGS. 5C and 6C. While rotating to the upward carrying position, the distal end portion 34 of the support member 12 is guided inward toward the rear side 18 of the display device 10 and passes through the position shown in FIGS. 5B and 6B. Accordingly, the display device 10 does not need to be flipped over to carry the display device 10 when the support member 12 is rotated to an upward carrying position. Rotation of the support member 12 to the upward carrying position obviates the risk of damaging the display device 10 due to flipping the display device 10 over for carry, as would be required for carrying it when in the inward folded position of FIG. 4.

The movement sequence of converting the support member between the support stand mode and the carrying handle mode is illustrated in FIGS. 5A-5C and FIGS. 6A-6C. The swivel portion 28 allows the support member 12 to swivel toward and away from the rear side 18 of the display device 10 at a pivot angle $\theta_P$. The swivel portion 28 prevents the support member 12 from swiveling farther away from the rear side 18 when the support member 12 is pivoted to a pivot angle $\theta_P$ equal to the maximum pivot angle $\theta_{P-max}$ (see FIG. 3). The swivel portion 28 also allows the support member 12 to be positioned at a pivot angle $\theta_P$ equal to a minimum support angle $\theta_{P-min}$ (see FIG. 4), where the swivel portion 12 is in the inward folded position immediately adjacent to the rear side 18. A user may selectively position the support member 12 at a pivot angle $\theta_P$ between the maximum support angle $\theta_{P-max}$ and the minimum support angle $\theta_{P-min}$ to achieve a desired viewing angle for the display screen 16.

From the support stand mode (see FIGS. 3, 5A and 6A), a user may lean the display device 10 forward while supporting the display device 10 on the surface S. While the display device 10 is leaning forward, the user may rotate the support member 12 about rotation axis R in a clockwise rotation direction, as seen in FIGS. 5B and 6B. Although the support member 12 is shown as rotating in a clockwise direction, the support member may alternatively rotate in the counterclockwise direction. Internal mechanisms in the swivel portion 28 may restrict the support member 12 to rotate around a predetermined path about the rotation axis R (see FIGS. 5B and 6B), as discussed later.

The support member 12 may be rotated along the predetermined path to the upward carrying position, at which point the display device 10 is in the carrying handle mode, as shown in FIGS. 5C and 6C. When in the carrying handle mode, the user may grip the gripping portion 38 to easily carry the display device 10 (see FIG. 12). Once in the upward carrying position, the internal cam mechanism in the swivel portion 28 restricts the support member 12 from further rotating in the clockwise rotation direction about the rotation axis R. The swivel portion 28 is configured to selectively retain the support member 12 in the upward carrying position to prevent the support member 12 from inadvertently or unintentionally rotating therefrom. The distal end portion 34 of the support member 12 may be rotated inward and disposed in a recessed portion 19 on the rear side 18 of the display device 10 when the support member 12 is in the carrying handle mode. The support member 12 should have sufficient structural rigidity and tensile strength to support the weight of the display device 10 when a user carries the display device 10 by the support member 12.

Figure 9:
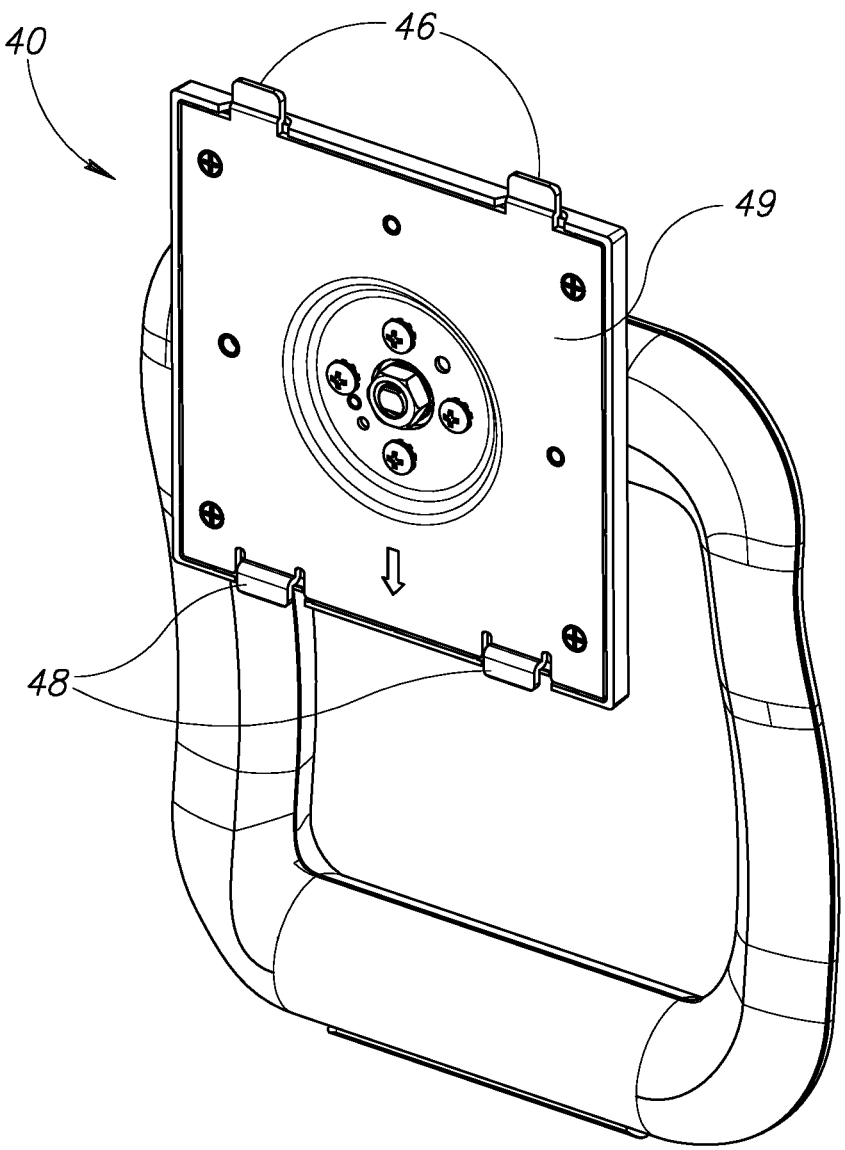
FIG. 9 is a front perspective view of the mounting apparatus of FIG. 7.
Figure 10:
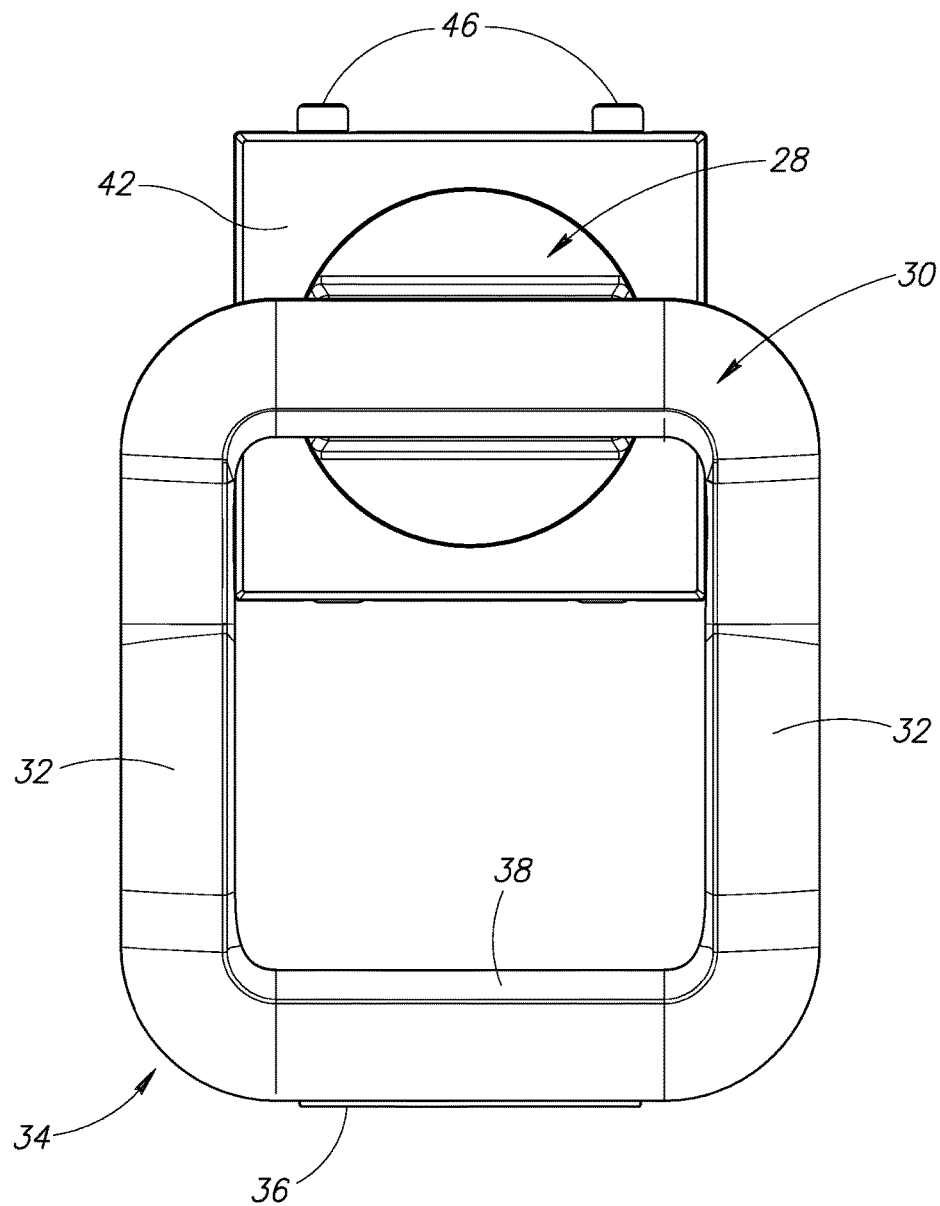
FIG. 10 is a rear view of the mounting apparatus of FIG. 7.

The support member 12 may be integrally formed with the display device 10 or removably attachable to the display device 10 as shown in FIGS. 7-11. In this configuration, the support member 12 may be part of a mounting apparatus 40 that may attach to a rear side 18 of the display device 10. The mounting apparatus 40 may have a mounting portion 42 with a mounting plate 49, as seen in FIG. 9. The mounting plate 49 has upper attachment portions 46 and lower attachment portions 48. The mounting portion 42 and mounting plate 49 may be sized and shaped to fit into a mounting recess 44 on the rear side 18 of the display device 10. The mounting recess 44 has upper receiving portions 52 and lower receiving portions 54. The mounting plate 42 may be attached to the mounting portion 49 so as to support the entire weight of the display device 10. The mounting plate 42 may be sized and shaped to fit to the display device 10 according to the VESA Mounting Interface Standard. The mounting apparatus 40 has a swivel portion 28 that is substantially identical to the swivel portion 28 previously discussed (see FIGS. 4, 5A-5C and 6A-6C). That is, the swivel portion 28 of the mounting apparatus 40 allows the support member 12 transform between a support stand mode and a carrying handle mode in the manner discussed with respect to FIGS. 1-6C.

Figure 11:
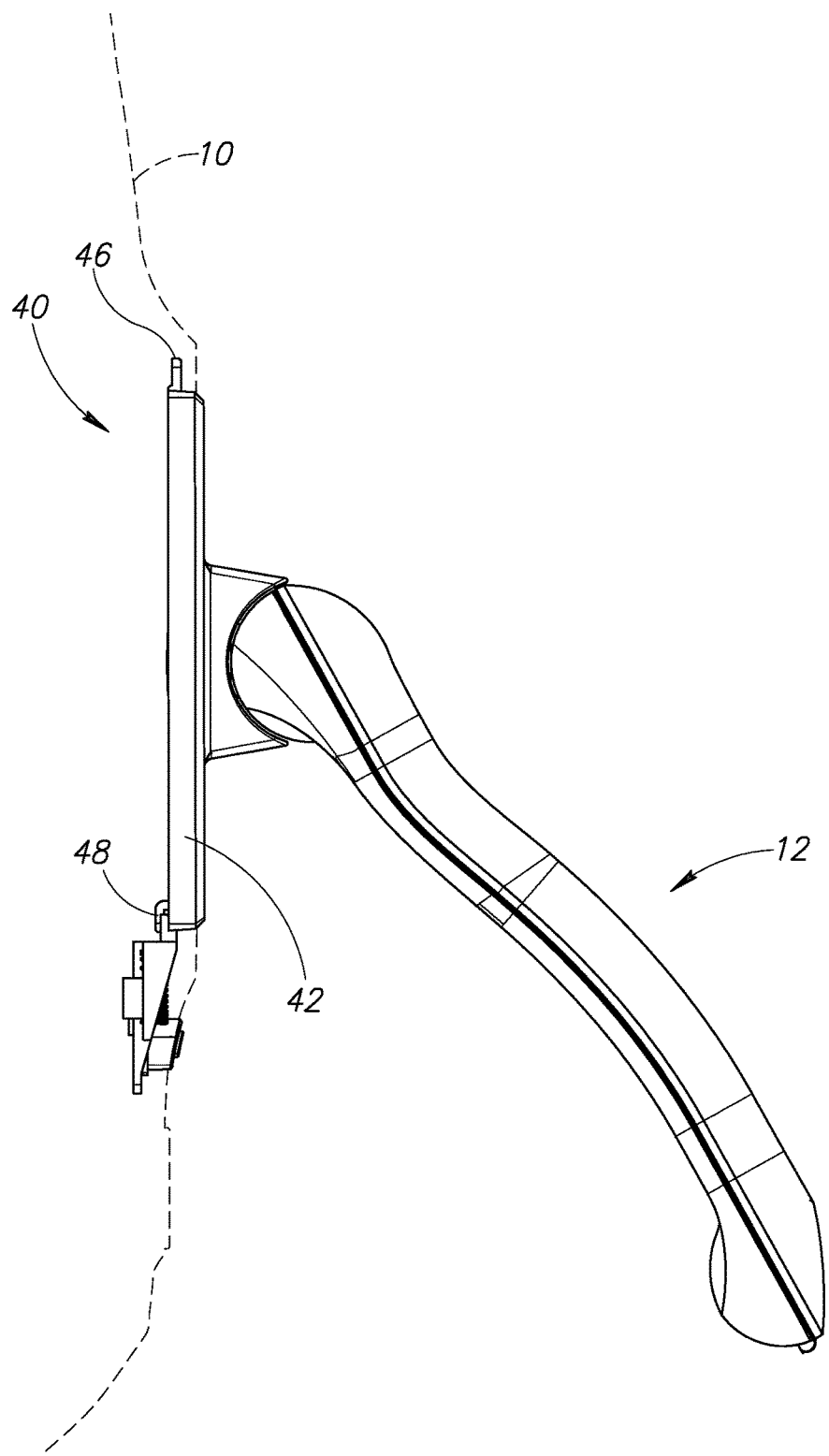
FIG. 11 is a right side view of the mounting apparatus of FIG. 7 installed in a mounting recess of the display device.

To attach the mounting apparatus 40 to the display device, the upper attachment portions 46 may be attached to the upper receiving portions 52. Then, the lower attachment portions 48 may be attached to the lower receiving portions 54. The lower receiving portions 48 may be compressed to receive and retain the lower attachment portions 54. For example, the spring-loaded lower receiving portions 54 may be spring-loaded and have angled portions facing away from the display device 50, as shown in FIG. 11. The lower receiving portions 54 move downward away from the lower attachment portions 48 when the lower attachment portions 48 are pushed against the angled portions of the lower receiving portions 54. Once the lower attachment portions 48 clear the lower receiving portions 54, the lower receiving portions 54 actuate back upward to the original position and into place over the lower attachment portions 48, retaining the mounting portion 42 in the mounting recess 44 against rearward movement. The lower receiving portions 54 may be manually pushed downward to remove the lower attachment portions 48 therefrom and detach the mounting portion 42 from the mounting recess 44.

Figure 13A:
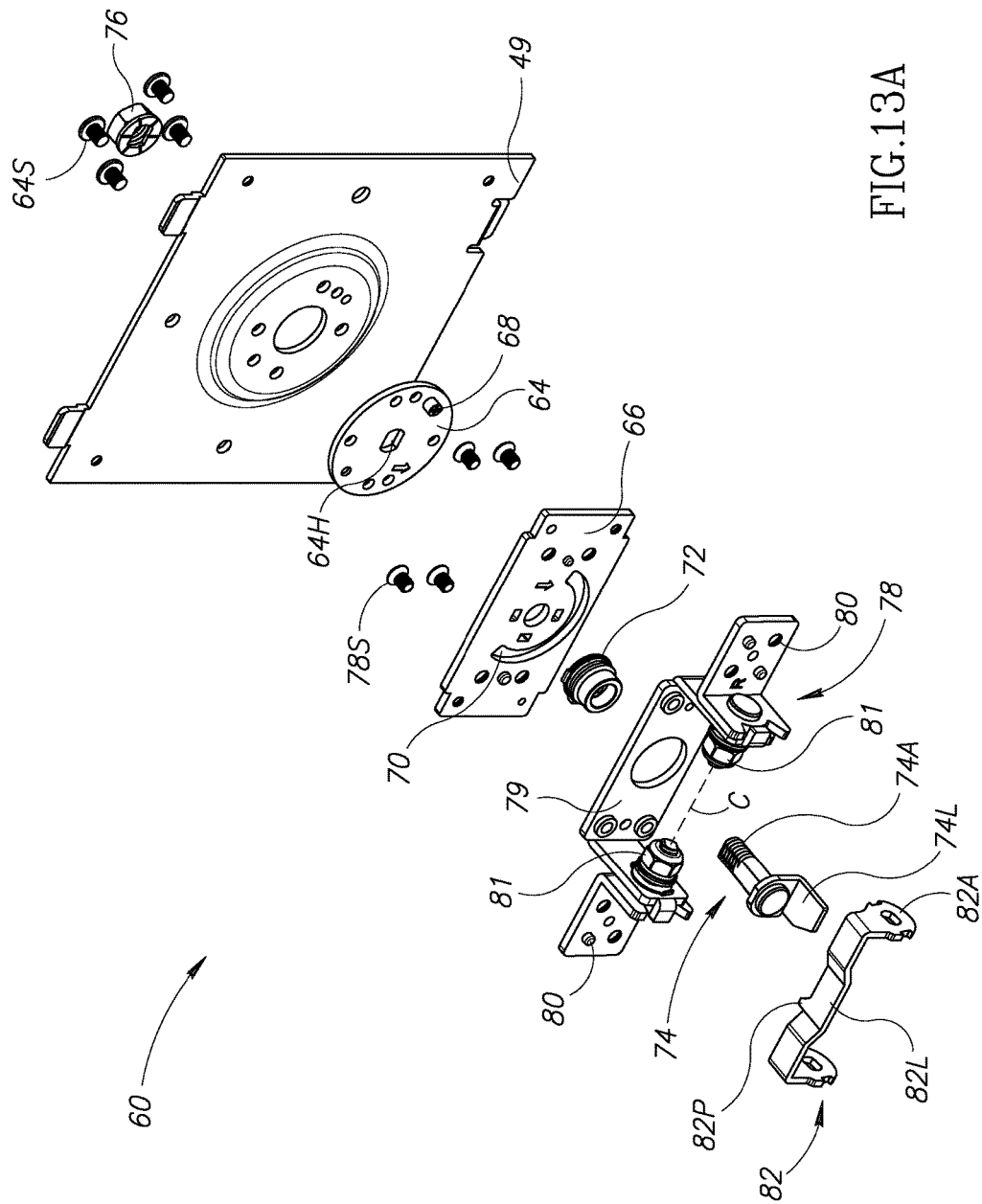
FIG. 13A is an exploded view of a swivel assembly of the support member of FIG. 1.

The swivel portion 28 has a swivel assembly 60 (see FIGS. 13A-13B) that enables the support member 12 to convert between the carrying handle mode and the support stand mode. The swivel portion 28 has a pivot mechanism that includes a fixed plate 64 and a pivot plate 66. The fixed plate 64 is fixedly attached to the mounting plate 49 via screws 64S. The pivot plate 66 is rotatably attached to the fixed plate 64 such that the pivot plate 66 may rotate along a fixed path relative to the fixed plate 64. In particular, a guide member 68 of the fixed plate 64 projects into an arcuate guide track 70 of the pivot plate 66. When the pivot plate 66 is rotated, the guide member 68 moves along the guide track 70, fixing the length and rotation path of the pivot plate 66 relative to the fixed plate 64. A spacer 72 may be separated into a back portion (not shown) and a front portion. The back portion of the spacer 72 is positioned between the fixed plate 64 and the pivot plate 66, spacing the fixed plate 64 and pivot plate 66 apart. The front portion of the spacer 72 is positioned on a face of the pivot plate 66 that faces away from the fixed plate 64.

An attachment plate 79 of folding mechanism 78 is fixedly attached to the pivot plate 66 via screws 78S. An L-bracket 74 secures the folding mechanism 78, the mounting plate 79, and the swivel assembly 60 together. An attachment portion 74A of the L-bracket 74 is inserted through the folding mechanism 78, the spacer 72, the pivot plate 66 and the fixed plate 64 to secure the swivel assembly 60 together. A nut 76 is threadably received on a threaded end portion of the attachment portion 74A. The attachment portion 74A has a similar size and shape as a plate aperture 64H of the fixed plate 64 to fix the orientation of the L-bracket 74, the fixed plate 64, and the mounting plate 49 relative to each other. The pivot plate 66 and the folding mechanism 78 may therefore rotate together about the attachment portion 74A relative to the fixed plate 64 and the mounting plate 49.

Figure 13B:
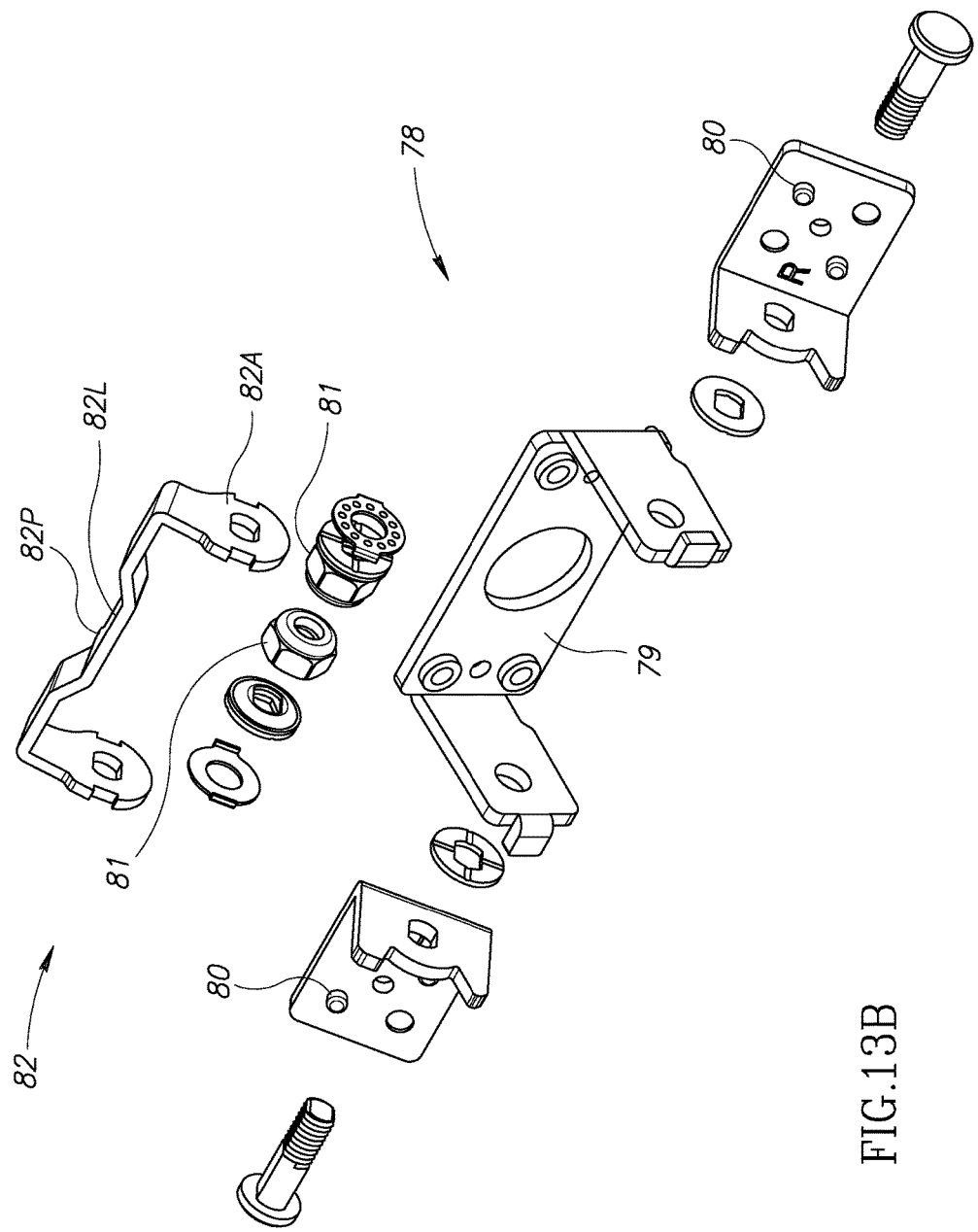
FIG. 13B is an exploded view of a folding mechanism and attachment plate of the swivel assembly of FIG. 13A.
Figure 14:
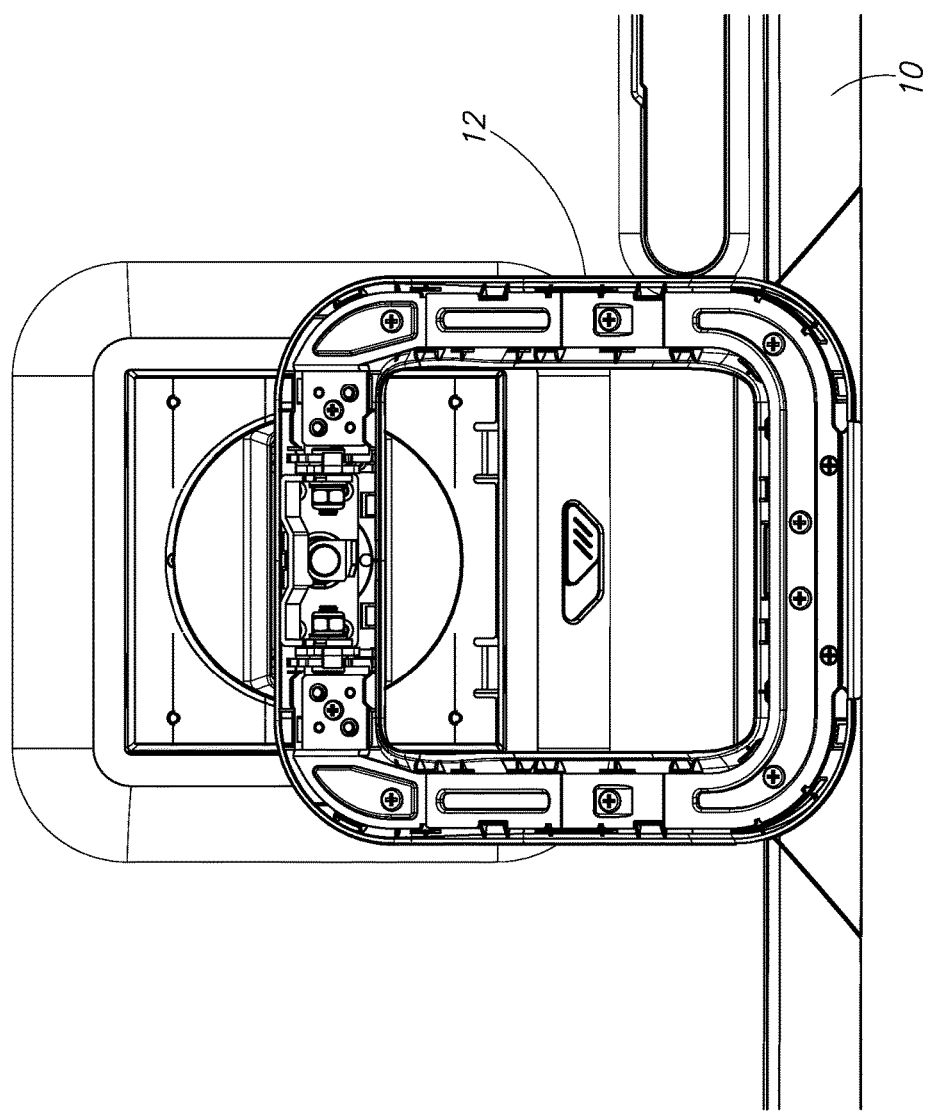
FIG. 14 is a rear view of the swivel assembly of FIG. 13A in a first position corresponding to the first position of FIGS. 5A and 6A.

The folding mechanism 78 is shown in detail in FIG. 13B. The folding mechanism 78 includes support member attachment portions 80, bracket attachment portions 81 and locking bracket 82. Folding mechanism 78 may rotate about axis C (see FIG. 13A) relative to the attachment plate 79. An internal support structure 13 of the support member 12 may attach to support member attachment portions 80, as seen in FIG. 14. A locking bracket 82 is attached to bracket attachment portions 81 of the folding mechanism 78. The locking bracket 82 has a protrusion 82P and a locking portion 82L which are described below. The bracket attachment portions 81 include threaded screw portions having a generally rectangular cross-sectional shape with oblong threaded sides (see FIG. 13B). The support member attachment portions 80 and bracket arms 82A of the locking bracket 82 have apertures that are sized and shaped to match the generally rectangular cross-sectional shape and oblong threaded sides of the bracket attachment portions 81. The attachment plate 79 has round apertures in which bracket attachment portions 81 may rotate about the axis C. The support member attachment portions 80, bracket attachment portions 81, and locking bracket 82 rotate together about the axis C. The distal end portion 34 of the support member 12 is moved relative to the mounting plate 49 (or rear side 18 of the display device 10) when the folding mechanism 78 rotates about the axis C relative to the attachment plate 79.

In the support stand mode, the internal support structure 13 of the support member 12 extends downward (i.e. rotation angle $\theta_R=0°$) and away (e.g. pivot angle $\theta_P=\theta_{MAX}$) from the mounting plate 49, as illustrated in FIGS. 1 and 14. Because distal end portion 34 of the support member 12 is spaced away from the mounting plate 49 in the support stand mode, the locking bracket 82 and support member attachment portions 80 are tilted toward the mounting plate 49 (or rear side 18 of the display device 10), as shown in FIG. 14.

Figure 15A:
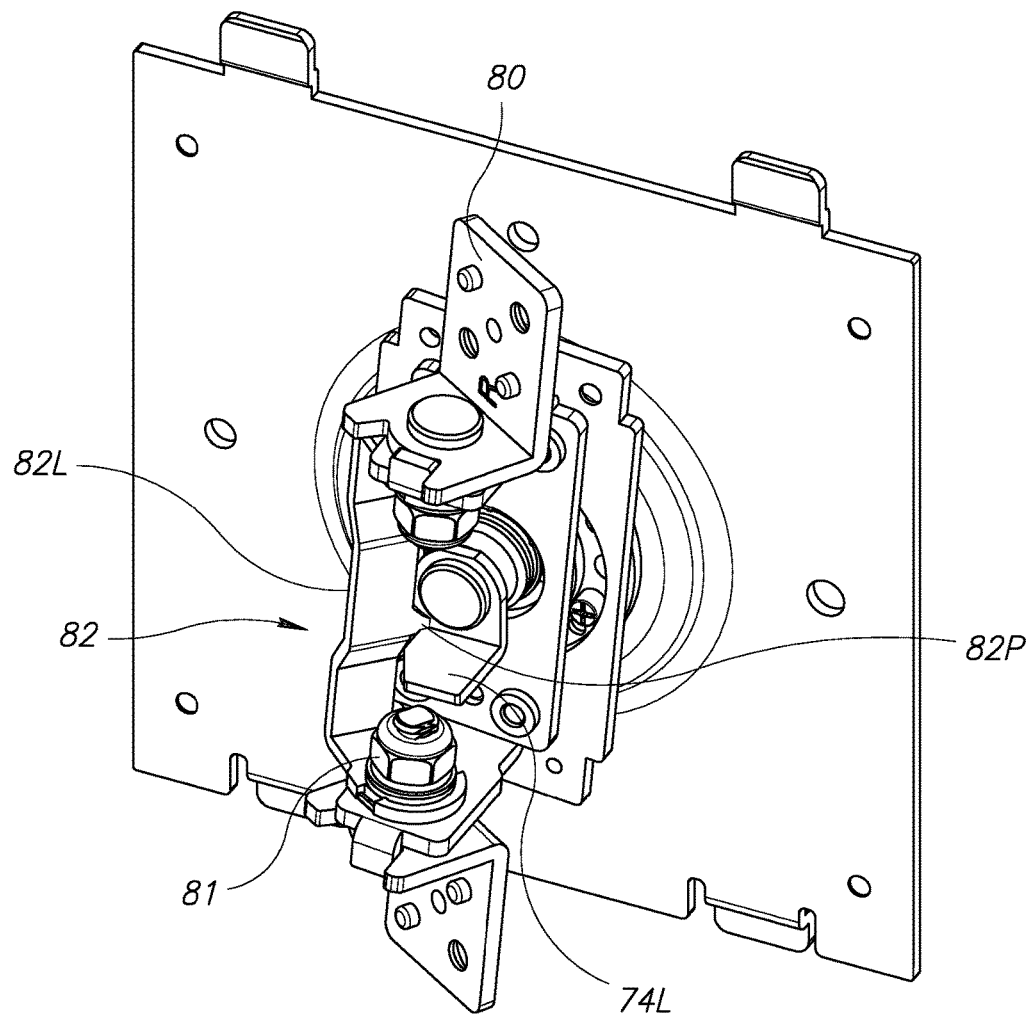
FIG. 15A is a rear view of the swivel assembly of FIG. 13A in a second position corresponding to the second position of FIGS. 5B and 6B.
Figure 15B:
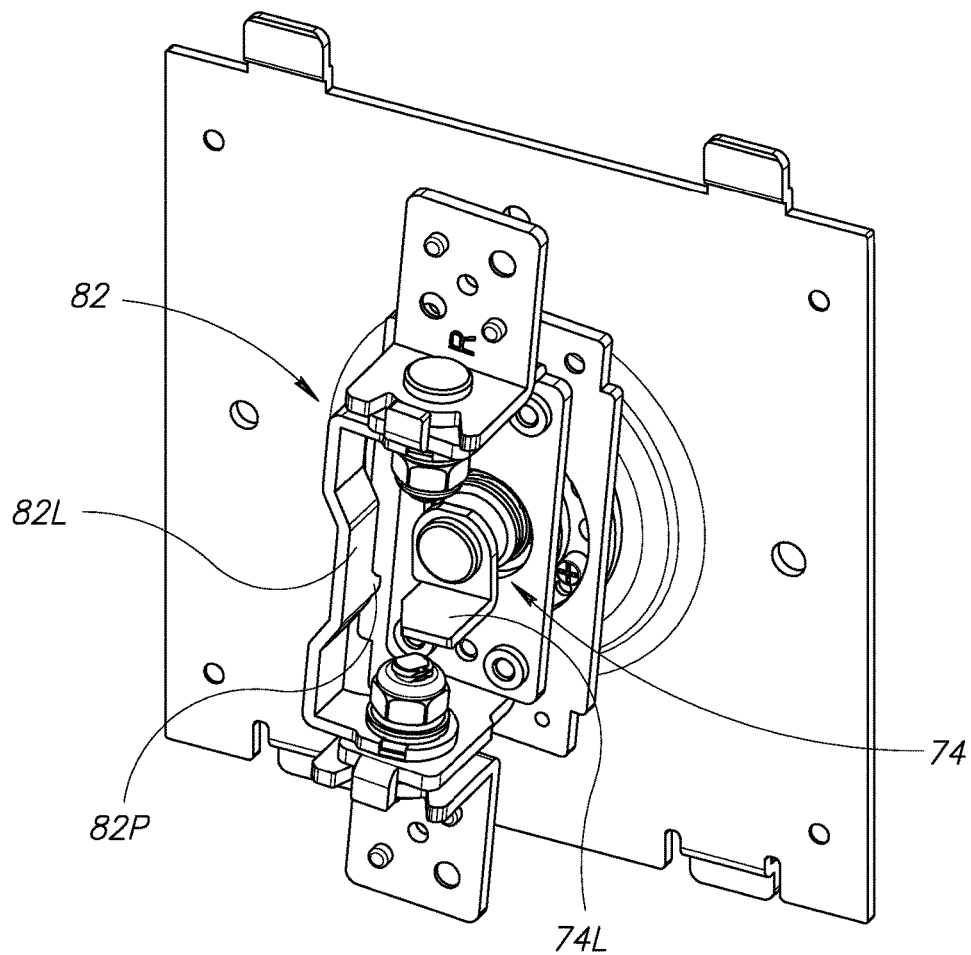
FIG. 15B is a rear left side perspective view of the swivel assembly of FIG. 13A in a third position.

From the support stand mode, the support member 12 may be rotated toward the upward carrying position about the rotation axis R, as shown in FIGS. 15A and 15B. However, at a certain rotation angle $\theta_R$, the support member 12 cannot be further rotated upward unless the distal end portion 34 of the support member 12 is pivoted toward the mounting plate 49 (or the rear side 18 of the display device 10). Specifically, if the distal end portion 34 is not sufficiently pivoted toward the mounting plate 49 (or the rear side 18 of the display device 10) at a rotation angle $\theta_R$ of approximately 90°, the protrusion 82P of the locking bracket 82 will contact a locking plate 74L of the L-bracket 74 (see FIG. 15A). The contact of the protrusion 82P against the locking plate 74L prevents the pivot plate 66 and folding mechanism 78 from further rotating about the rotation axis R. On the other hand, when the support member 12 is pivoted toward the mounting plate 49 (or the rear side 18 of the display device 10) at a small pivot angle $\theta_P$, the protrusion 82P of the locking bracket 82 will not contact the locking plate 74L (see FIG. 15B). Accordingly, the support member 12 may be further rotated about the rotation axis R toward the upward position when the support member 12 when the support member 12 is pivoted toward the mounting plate 49 (or the rear side 18 of the display device 10) at a small pivot angle $\theta_P$.

Figure 16:
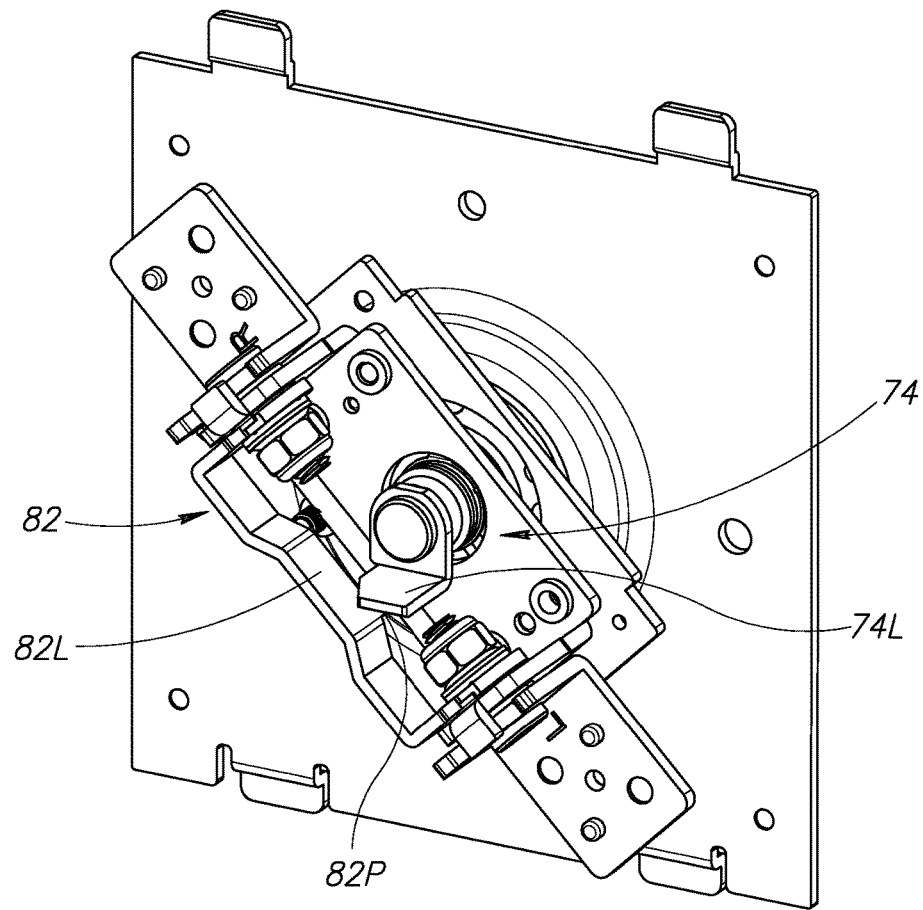
FIG. 16 is a rear left side perspective view of the swivel assembly of FIG. 13A in a fourth position.

Once the distal end portion 34 of the support member 12 is rotated past the rotation angle $\theta_R$ of approximately 90° (see FIGS. 5B and 6B), the locking portion 82L of the locking bracket 82 is rotated to be underneath and in contact with the locking plate 74L of the L-bracket 74. When the flat surface of the locking portion 82L is in contact with the locking plate 74L, as shown in FIG. 16, the locking bracket 82 cannot be pivoted away from the mounting plate 49. This prevents the distal end portion 34 from pivoting away from the mounting plate 49 (or rear side 18 of the display device 10) once the support member 12 is rotated past the rotation angle $\theta_R$ of approximately 90°.

Figure 17:
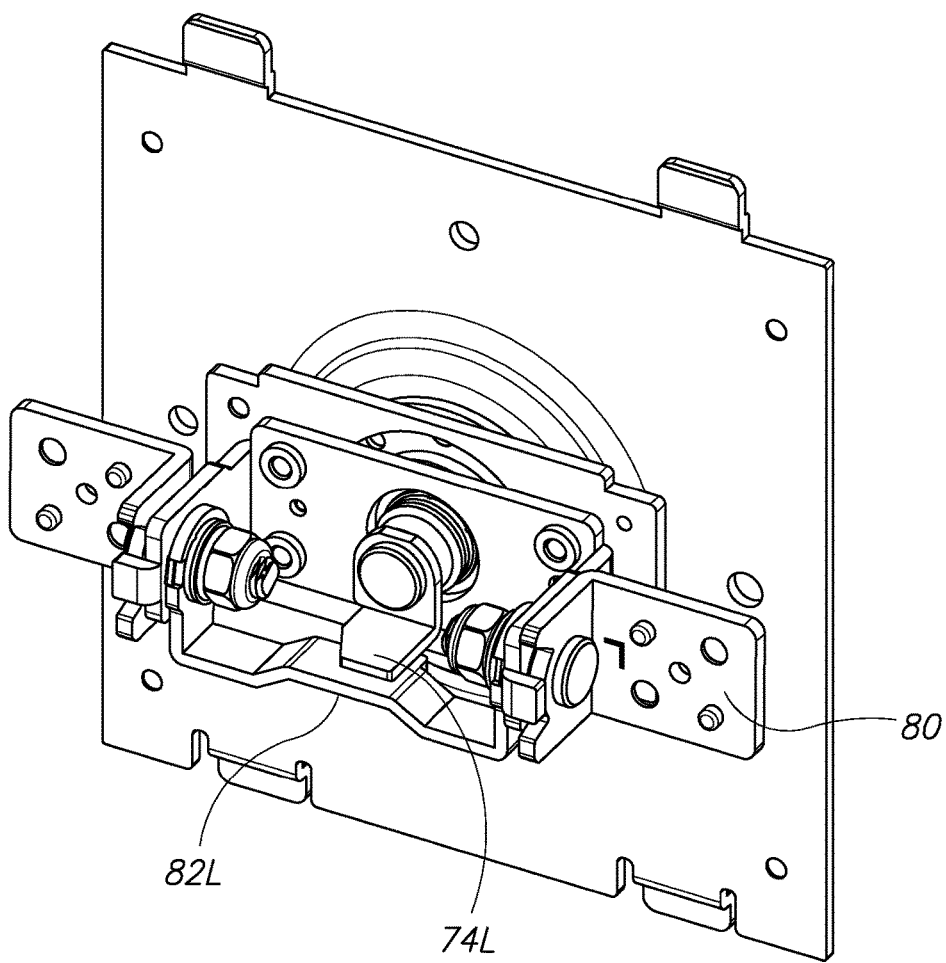
FIG. 17 is a rear left side perspective view of the swivel assembly of FIG. 13A in a fifth position corresponding to the third position of FIGS. 5C and 6C.

From the position of the support member 12 shown in FIGS. 5B, 6B, and 16, the support member 12 may be further rotated to the upward carrying position (see FIG. 17). In the upward carrying position, the locking portion 82L of the locking bracket 82 is flush against the locking plate 74L of the L-bracket 74, as shown in FIG. 17. When a user carries a display device by the support member 12, the weight of the display device 10 is directed downward from the locking plate 74L to the locking portion 82L of the locking bracket 82. A user may then carry the display device 10 by the support member 12, as shown in FIG. 12. As the distal end portion 34 of the support member 12 is disposed in the recess 19, the support member 12 is closely aligned with the center of gravity of the display device 10. Therefore, the display device 10 may be substantially vertically oriented when a user carries the display device 10 by the support member 12 in the upward carrying position, allowing easy and comfortable carrying of the display device 10.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare statement of "two recitations," without other modifiers, typically means at least two recitations, or two or more recitations).

What is claimed is:

1. A selectively attachable mounting apparatus for a display device, comprising:
    an attachment portion configured to selectively and removably attach the mounting apparatus to a rear portion of the display device;
    a convertible support member extending from the attachment portion, the support member being selectively rotatable about a rotation axis between a first position and a second position, the support member extending from the attachment portion in a first direction when the support member is in the first position, and the support member extending from the attachment portion in a second direction when the support member is in the second position, wherein the support member is configured to move closer to the attachment portion as the support member is rotated about the rotation axis from the first position to the second position, and wherein the support member is configured to move away from the attachment portion as the support member is rotated about the rotation axis from the second position to the first position.

2. The mounting apparatus of claim 1, wherein the attachment portion has an upper side portion configured to attach to an upper rear side of the display device and a lower side portion configured to attach to a lower rear side of the display device, wherein the first direction is a lower side portion direction and the second direction is an upper side portion direction.

3. The mounting apparatus of claim 1, wherein, (i) when the support member is in the first position and the attachment portion is attached to the display device, the support member is configured to support the second side of the display device at an angle for viewing the display screen, and (ii) when the support member is in the second position and the attachment portion is attached to the display device, the support member is configured to allow a user to grip the support member to carry the display device in a substantially vertical orientation.

4. The mounting apparatus of claim 1, wherein the support member has a distal end portion that includes a base portion and a gripping portion, the base portion being configured to support the display device in concert with the bottom side when the support member is in the first position and the attachment portion is attached to the display device, and the gripping portion being configured to allow a user to grip the gripping portion and carry the display device thereby when the support member is in the second position and the attachment portion is attached to the display device.

5. The mounting apparatus of claim 1, further comprising a swivel portion that rotatably connects the support member to the attachment portion, the swivel portion being configured to rotate the support member about the rotation axis relative to the attachment portion.

6. The mounting apparatus of claim 5, wherein the rotation axis is an axis that is orthogonal to a rear surface of the attachment portion.

7. The mounting apparatus of claim 1, wherein the support member has a distal end portion, wherein an attachment plane is defined as a plane on which the attachment portion extends, wherein the distal end of the support member crosses a plane that is coplanar to the attachment plane when moving from the first position to the second position.

* * * * *